United States Patent [19]
Pan

[11] Patent Number: 5,813,664
[45] Date of Patent: Sep. 29, 1998

[54] BACK-END CAPACITOR WITH HIGH UNIT CAPACITANCE

[75] Inventor: Yang Pan, Singapore, Singapore

[73] Assignee: Chartered Semiconductor Manufacturing Ltd., Singapore, Singapore

[21] Appl. No.: 686,785

[22] Filed: Jul. 26, 1996

Related U.S. Application Data

[62] Division of Ser. No. 545,413, Oct. 19, 1995, Pat. No. 5,571,746.
[51] Int. Cl.$^6$ ................................................. H01L 21/8242
[52] U.S. Cl. ........................................... 257/303; 257/306
[58] Field of Search ..................................... 438/243–256, 438/386–398; 257/296–309

[56] References Cited

U.S. PATENT DOCUMENTS

| | | |
|---|---|---|
| 4,495,222 | 1/1985 | Anderson et al. ........................ 427/89 |
| 5,471,418 | 11/1995 | Tanigawa . |
| 5,624,864 | 4/1997 | Arita et al. . |

*Primary Examiner*—Jey Tsai
*Attorney, Agent, or Firm*—George O. Saile; Stephen B. Ackerman; Larry J. Prescott

[57] ABSTRACT

This invention provides a structure and a method of forming a capacitor with a high unit capacitance for use in analog circuits and a bond pad which will eliminate bond pad peeling during subsequent processing. The bottom capacitor plate is formed at the same time the bond pads are formed. The bottom capacitor plate and the bond pads are formed using a conducting material, such as doped polysilicon, which will eliminate bond pad peeling during subsequent processing. The top capacitor plate is formed when the top electrode pattern is formed. This integrated process provides a bond pad which will eliminate bond pad peeling during subsequent process steps and a capacitor with high unit capacitance for use in analog circuits.

11 Claims, 3 Drawing Sheets

BACK-END CAPACITOR WITH HIGH UNIT CAPACITANCE

This is a Divisional application under 37 CFR 1.60 of prior application Ser. No. 08/545,413 filed on Oct. 19, 1995, now U.S. Pat. No. 5,571,746.

BACKGROUND OF THE INVENTION

1. Field of the Invention

This invention deals with the formation of a capacitor having a high unit capacitance for analog circuits. Bond pads are formed at the same time the bottom capacitor plate is formed using a conducting material which will avoid bond pad peeling during subsequent processing.

2. Description of the Related Art

Anderson et al., U.S. Pat. No. 4,495,222 shows the use of polysilicon under the bond pad to eliminate bond pad peeling during subsequent processing. In the invention of this Patent Application, however, a bottom capacitor plate is formed at the same time the bond pads are formed. This integrated process step provides a bond pad which will eliminate bond pad peeling during subsequent process steps and a capacitor with high unit capacitance for use in analog circuits. The top capacitor plate is formed at the same time the top electrode pattern is formed.

SUMMARY OF THE INVENTION

Capacitors with two metal plates or one metal and one polysilicon plate integrated into an integrated circuit element are often used in analog circuit applications because of their high degree of linearity. It is difficult to obtain a sufficiently large capacitance per unit area in these capacitors to enable them to be used without stacking.

Input/output connections for an integrated circuit elements often use a bond pad formed on a layer of dielectric material such as silicon dioxide or borophosphosilicate glass. Special care must be taken to prevent peeling of the bond pad from the dielectric material.

It is an objective of this invention to provide a method of forming a capacitor with high capacitance per unit area and simultaneously forming a bond pad interface which will prevent bond pad peeling.

It is a further objective of this invention to provide a capacitor with a high capacitance per unit area for use in analog circuits and a bond pad interface which will prevent bond pad peeling.

These objectives are achieved by means of a bottom plate capacitor trench and a bond pad trench formed in a layer of interlevel dielectric. The interlevel dielectric is formed over a semiconductor substrate having devices formed therein. The bottom plate capacitor trench and the bond pad trench are filled with a conductor material such as doped polysilicon thereby forming a bottom capacitor plate and a bond pad. A capacitor dielectric is formed over the bottom capacitor plate and a metal top capacitor plate is formed over the capacitor dielectric. The polysilicon interface between the bond pad and the interlevel dielectric prevents bond pad peeling and the capacitor structure provides good capacitor linearity and a capacitance per unit area in excess of 0.5 femtofarads per square nanometer.

DESCRIPTION OF THE PREFERRED EMBODIMENTS

Figure 1:
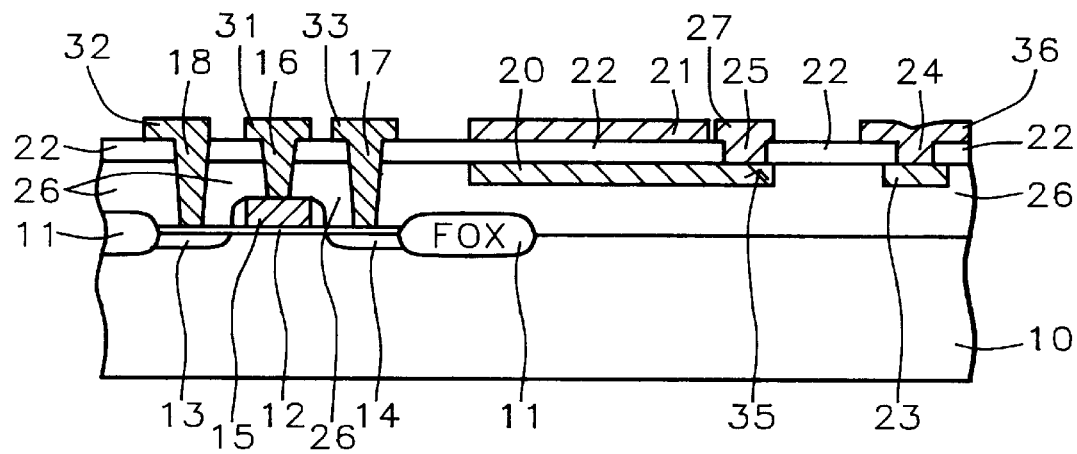
FIG. 1 shows a cross section view of a semiconductor substrate with the capacitor structure, bond pads, bond pad contacts, device contacts, and top metal pattern formed taken along line 1–1' of FIG. 6.
Figure 2:
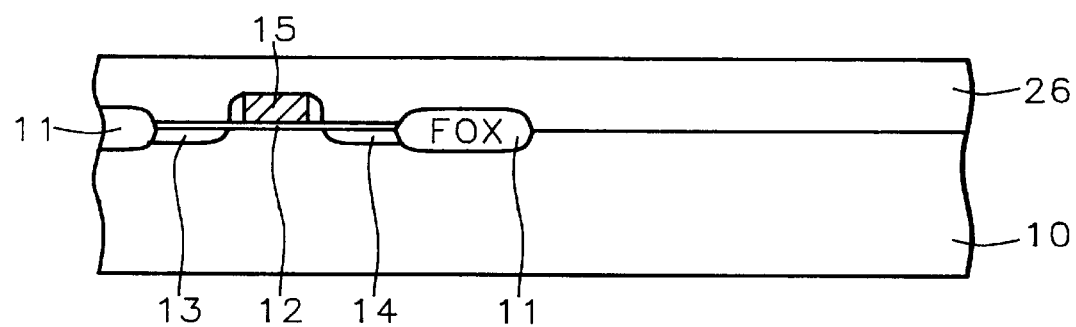
FIG. 2 shows a cross section view of the semiconductor substrate with devices formed therein and interlevel dielectric formed thereon taken along line 1–1' of FIG. 6.

Refer now to FIGS. 1–6 there is shown an embodiment of a method of forming the capacitor and bond pad structure of this invention. FIG. 2 shows a semiconductor substrate 10 with a field effect transistor formed therein. The field effect transistor comprises source/drain regions 13 and 14, a gate dielectric layer 12, a gate electrode 15, and field oxide isolation regions 11. An interlevel dielectric layer 26 is formed over the silicon substrate. The interlevel dielectric is a material such as borophosphosilicate glass or boron doped tetraethyl orthosilicate material.

Figure 3:
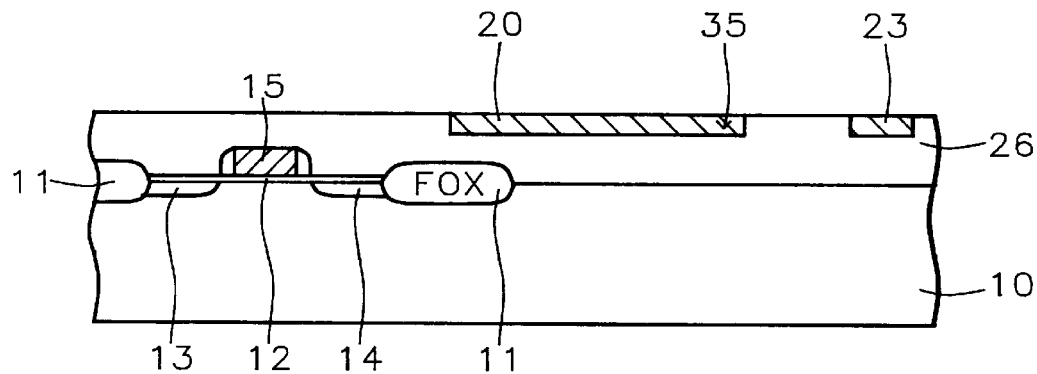
FIG. 3 shows a cross section view of the semiconductor substrate with the bottom capacitor trench and bond pad trenches formed in the interlevel dielectric and filled with conductor material taken along line 1–1' of FIG. 6.

As shown in FIG. 3 trenches are then formed in the interlevel dielectric for the bottom capacitor plate, the bottom capacitor contact, and the bond pads. FIG. 3 shows only one of the bond pads. The mask used for this step is the only additional mask required over the masks required to form the integrated circuit element without the capacitor. These trenches are then filled with a first conductor material to form the bottom capacitor plate 20, the bottom capacitor contact 35, and the bond pad 23. As shown in FIG. 3, the capacitor contact 35 is electrically connected to the bottom capacitor plate 23. The first conductor material is preferably a material such as doped polysilicon so that doped polysilicon is formed in the bond pad area as the bottom capacitor plate is formed. Polysilicon at the interface between the bond pad and the interlevel dielectric is effective in preventing bond pad peeling during subsequent processing. This is achieved without the need of extra process steps. A metal such as tungsten can also be used for the first conductor material.

Figure 4:
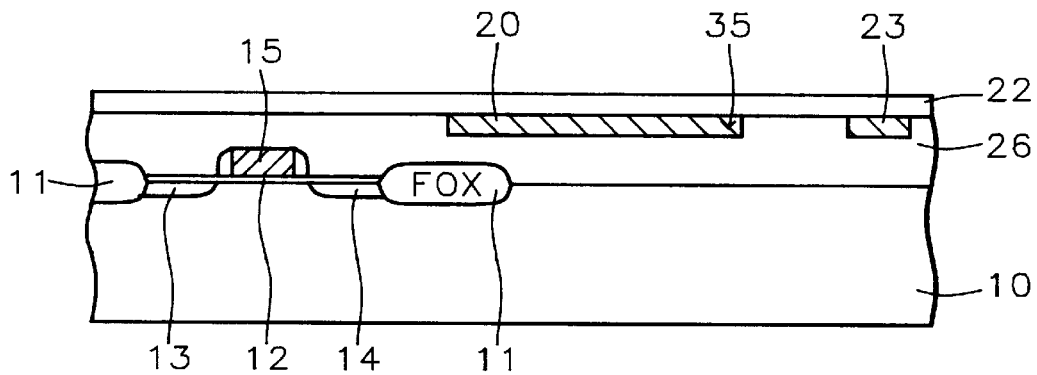
FIG. 4 shows a cross section view of the semiconductor substrate with the capacitor dielectric formed over the bottom capacitor plate, the bond pad, and the interlevel dielectric taken along line 1–1' of FIG. 6.

Next, as shown in FIG. 4, a layer of capacitor dielectric 22 is formed over the interlevel dielectric 26, the bottom capacitor plate 20, and the bond pads 23. The capacitor dielectric is a material such as ONO, oxide nitride oxide layered structure or sandwich structure, or TEOS, tetraethyl orthosilicate, with a thickness of between about 300 and 700 Angstroms. This capacitor dielectric thickness provides a capacitance per unit area in excess of 0.5 femtofarads per square nanometer.

Figure 5:
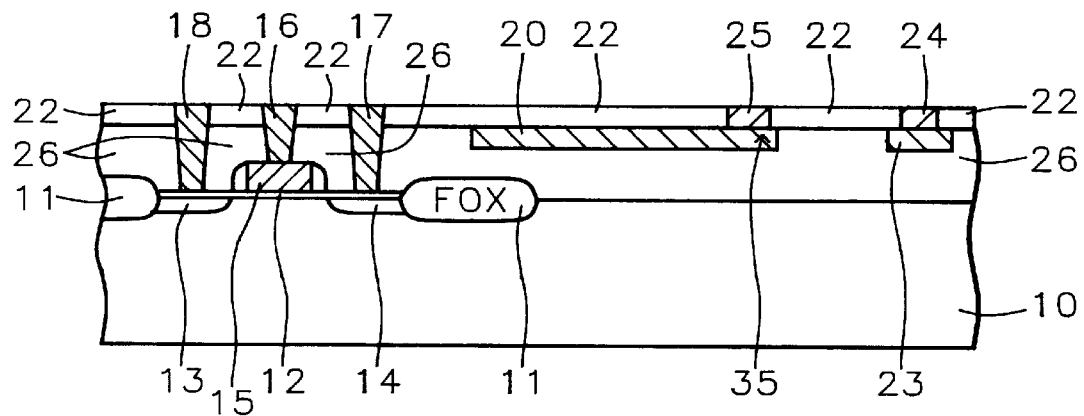
FIG. 5 shows a cross section view of the semiconductor substrate with the capacitor dielectric formed over the bottom capacitor plate, the bond pad, and the interlevel dielectric, the bond pad contact holes, the bottom capacitor contact hole, and the device contact holes taken along line 1–1' of FIG. 6.

Next, as shown in FIG. 5, contact holes in the capacitor dielectric 22 are formed for the bond pads 24 and the bottom capacitor plate 25. Only one bond pad and one bond pad contact hole is shown, although it will be obvious to those skilled in the art that this method is equally applicable to a number of bond pad and bond pad contact holes. Contact holes are also formed in both the capacitor dielectric 22 and the interlevel dielectric 26 for device contacts 16, 17, and 18. These contact holes are then filled with a second conducting material such as a composite of titanium/titanium nitride and tungsten.

As shown in FIG. 1, a first metal electrode pattern is formed over capacitor dielectric 22, the filled bond pad contact holes 24, the bottom capacitor contact hole 25, and the filled device contact holes 16, 17, and 18. The first metal electrode pattern forms the top capacitor plate 21, the electrode 36 to one of the filled bond pad contact holes 24, the electrode 27 to the filled bottom capacitor contact hole 25, and the electrodes 31, 32, and 33 to the filled device contact holes 16, 17, and 18. The first metal electrode pattern is formed of a material such as a composite of aluminum/silicon/copper. FIG. 1 is a cross section view of the capacitor and bond pad structure taken along line 1–1' of FIG. 6.

Figure 6:
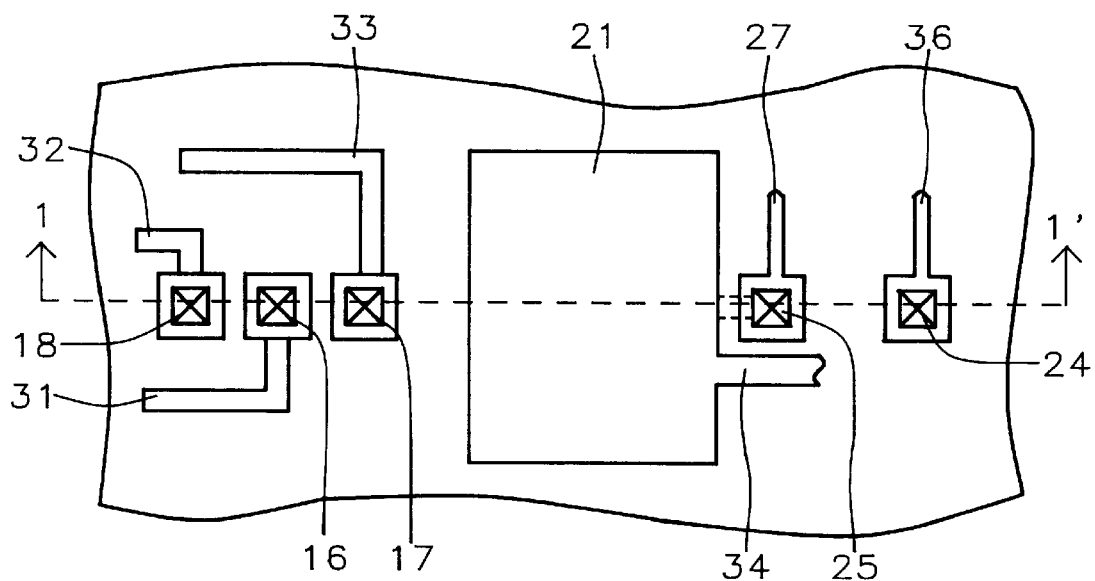
FIG. 6 shows a top view of the capacitor structure showing device contacts and bond pad contacts.

The top view of the first metal electrode pattern is shown in FIG. 6. FIG. 6 shows the top capacitor plate 21, the electrode 36 to one of the filled bond pad contact holes 24, the electrode 27 to the filled bottom capacitor contact hole 25, the electrode 34 to the top capacitor plate 21, and the electrodes 31, 32, and 33 to the filled device contact holes 16, 17, and 18.

In this embodiment the bottom capacitor plate and the bond pads are formed at the same time using only one extra mask beyond those masks required for the device without the capacitor. The conducting material used to form the bottom capacitor plate and the bond pads is chosen to prevent bond pad peeling when external electrodes are bonded to the bond pads.

Refer now to FIGS. 1 and 6, there is shown an embodiment of the capacitor and bond pad structure of this invention. The top view of the structure is shown in FIG. 6. FIG. 6 shows the top capacitor plate 21, the electrode 36 to one of the filled bond pad contact holes 24, the electrode 27 to the filled bottom capacitor contact hole 25, the electrode 34 to the top capacitor plate 21, and the electrodes 31, 32, and 33 to the filled device contact holes 16, 17, and 18.

A cross section view of the capacitor and bond pad structure, taken along line 1–1' of FIG. 6, is shown in FIG. 1. FIG. 1 shows a semiconductor substrate 10 with a field effect transistor formed therein. The field effect transistor comprises source/drain regions 13 and 14, a gate dielectric layer 12, a gate electrode 15, and field oxide isolation regions 11. An interlevel dielectric layer 26 is formed over the silicon substrate. The interlevel dielectric is a material such as borophosphosilicate glass or boron doped tetraethyl orthosilicate material.

Trenches are formed in the interlevel dielectric for the bottom capacitor plate, the bottom capacitor contact, and the bond pads. These trenches are then filled with a first conductor material to form the bottom capacitor plate 20, the bottom capacitor contact 35, and the bond pad 23. The capacitor contact 35 is electrically connected to the bottom capacitor plate 23. The first conductor material is preferably a material such as doped polysilicon so that doped polysilicon is formed in the bond pad area as the bottom capacitor plate is formed. Polysilicon at the interface between the bond pad and the interlevel dielectric is effective in preventing bond pad peeling during subsequent processing. This is achieved without the need of extra process steps. A metal such as tungsten can also be used for the first conductor material.

A layer of capacitor dielectric 22 is formed over the interlevel dielectric 26, the bottom capacitor plate 20, and the bond pads 23. The capacitor dielectric is a material such as ONO, oxide oxynitride, or TEOS, tetraethyl orthosilicate, with a thickness of between about 300 and 700 Angstroms. This capacitor dielectric thickness provides a capacitance per unit area in excess of 0.5 femtofarads per square nanometer. Contact holes are formed in the capacitor dielectric 22 for the bond pads 24 and the bottom capacitor plate 25. Only one bond pad and one bond pad contact hole is shown. Contact holes are also formed in both the capacitor dielectric 22 and the interlevel dielectric 26 for device contacts 16, 17, and 18. These contact holes are filled with a second conducting material, which in this example is also doped polysilicon.

A first metal electrode pattern is formed over capacitor dielectric 22, the filled bond pad contact holes 24, the bottom capacitor contact hole 25, and the filled device contact holes 16, 17, and 18. The metal electrode forms the top capacitor plate 21, the electrode 36 to one of the filled bond pad contact holes 24, the electrode 27 to the filled bottom capacitor contact hole 25, and the electrodes 31, 32, and 33 to the filled device contact holes 16, 17, and 18.

This capacitor and bond pad structure provides bond pads which will not peel during subsequent processing and a capacitor with a capacitance in excess of 0.5 femtofarads per square nanometer.

While the invention has been particularly shown and described with reference to the preferred embodiments thereof, it will be understood by those skilled in the art that various changes in form and details may be made without departing from the spirit and scope of the invention.

What is claimed is:

1. A capacitor structure, comprising:
    a semiconductor substrate having devices formed therein and a planarized layer of interlevel dielectric formed thereon;
    a bottom capacitor plate trench region, a bottom capacitor contact trench region, and a number of bond pad trench regions formed in said layer of interlevel dielectric;
    a bottom capacitor plate formed by filling said bottom capacitor trench region with a first conductor material;
    a bottom capacitor contact formed by filling said bottom capacitor contact trench with said first conductor material;
    a number of bond pads formed by filing said bond pad trench regions with said first conductor material;
    a layer of capacitor dielectric formed over said bottom capacitor plate, said bottom capacitor contact, said bond pads, and said layer of interlevel dielectric;
    a bottom capacitor contact hole and a number of bond pad contact holes formed in said capacitor dielectric;
    a number of device contact holes formed in said capacitor dielectric and said interlevel dielectric;
    a second conductor material filling said bond pad contact holes, said bottom capacitor contact hole, and said device contact holes;
    a layer of third conductor material formed over said capacitor dielectric, said bottom capacitor contact hole, said bond pad contact holes, and said device contact holes; and
    a top capacitor plate and a top electrode pattern formed in said layer of third conductor material.

2. The capacitor structure of claim 1 wherein said first conductor material is doped polysilicon.

3. The capacitor structure of claim 1 wherein said first conductor material is tungsten.

4. The capacitor structure of claim 1 wherein said inter-level dielectric is borophosphosilicate glass.

5. The capacitor structure of claim 1 wherein said inter-level dielectric is boron doped tetraethyl orthosilicate.

6. The capacitor structure of claim 1 wherein said capacitor dielectric is tetraethyl orthosilicate.

7. The capacitor structure of claim 1 wherein said capacitor dielectric is oxide nitride oxide layered structure.

8. The capacitor structure of claim 1 wherein said capacitor dielectric has a thickness of between about 300 and 700 Angstroms.

9. The capacitor structure of claim 1 wherein said top capacitor plate is formed directly above said bottom capacitor plate.

10. The capacitor structure of claim 1 wherein said second conductor material is titanium/titanium nitride and tungsten.

11. The capacitor structure of claim 1 wherein said third conductor material is aluminum/silicon/copper.

* * * * *